US009495974B1

(12) United States Patent
Chang et al.

(10) Patent No.: US 9,495,974 B1

(45) Date of Patent: Nov. 15, 2016

(54) METHOD OF PROCESSING SOUND TRACK

(71) Applicants: Tain-Tzu Chang, Taichung (TW); Chow-Ing Chang, Taichung (TW)

(72) Inventors: Tain-Tzu Chang, Taichung (TW); Chow-Ing Chang, Taichung (TW)

( * ) Notice: Subject to any disclaimer, the term of this patent is extended or adjusted under 35 U.S.C. 154(b) by 0 days.

(21) Appl. No.: 14/821,059

(22) Filed: Aug. 7, 2015

(51) Int. Cl.

*H03G 5/00* (2006.01)
*G10L 21/0356* (2013.01)
*G10L 25/18* (2013.01)
*G10L 21/0332* (2013.01)

(52) U.S. Cl.

CPC ....... *G10L 21/0356* (2013.01); *G10L 21/0332* (2013.01); *G10L 25/18* (2013.01)

(58) Field of Classification Search

CPC . G10L 21/038; G10L 19/0204; G10L 19/08; G10L 21/00; G10L 25/48; G10L 19/083; G10L 21/0388; G10L 19/005; G10L 19/008; G10L 19/02; G10L 19/0212; G10L 19/032; G10L 19/167; G10L 19/20; H04R 2430/03; H04R 3/04; H04R 3/14; H04R 2420/01; H04R 2499/13; H04R 3/12; H04R 1/26; H04R 2205/024; H04R 2430/01; H04R 2499/11; H04R 2499/15; H04R 3/005; H04R 3/02; H04R 5/02; H04R 5/04

USPC ............ 381/99, 56–58, 103–107, 17–22, 98, 381/119, 123; 704/500, 207

See application file for complete search history.

(56) References Cited

U.S. PATENT DOCUMENTS

| | | | | |
|---|---|---|---|---|
| 8,085,951 B2 * | 12/2011 | Trautmann | H03G 3/32 | 333/28 R |
| 8,094,826 B2 * | 1/2012 | Pedersen | H04S 3/00 | 381/103 |
| 2014/0149125 A1 * | 5/2014 | Son | G10L 21/038 | 704/500 |
| 2015/0222990 A1 * | 8/2015 | Hansen | H04R 3/04 | 381/103 |
| 2016/0104499 A1 * | 4/2016 | Hashimoto | G10L 19/032 | 381/58 |

* cited by examiner

*Primary Examiner* — Lun-See Lao

(74) *Attorney, Agent, or Firm* — WPAT, P.C., Intellectual Property Attorneys; Anthony King

(57) ABSTRACT

A method of processing a sound track includes providing a low frequency threshold and a high frequency threshold of an audible frequency range; selecting a low-pitch sound band from a lowest frequency of an original sound track to the low frequency threshold and raising the low-pitch sound band by a predetermined frequency shift to a modified low-pitch sound band, or selecting a high-pitch sound band from the high frequency threshold to the highest frequency of the original sound track and lowering the high-pitch sound band by a predetermined frequency shift to a modified high-pitch sound band; and combining original sound track and modified low-pitch sound band or combining original sound track and modified high-pitch sound band. The low and high frequency thresholds are not correlated. The predetermined frequency shift is one octave or multiple octaves or equals $2^n$, where n is a positive integer or a negative integer.

5 Claims, 4 Drawing Sheets

METHOD OF PROCESSING SOUND TRACK

FIELD OF THE INVENTION

The present invention relates to methods of processing a sound track and more particularly to a method of processing a sound track to thereby combine sounds synchronously and therefore enhance audibility thereof without generating any interference.

BACKGROUND OF THE INVENTION

Human beings' and the other animals' hearing is subject to limits of a specific bandwidth, and therefore audibility attenuates quickly outside the range of the specific bandwidth. The prior art discloses that frequency dependent amplification of the original sound to enhance audibility. But, in many cases, especially for old person, frequency response is more important than amplitude since their hearing bandwidth is very much limited. There are little tradition amplification can do to improve the audibility without further damaged the ear by excess sound level. To avoid this problem and improve the audibility, one can shift the inaudible bands into the audible bandwidth, and possibly with limited amplification.

Therefore, it is imperative to provide a method of processing a sound track to thereby combine sounds synchronously and therefore enhance audibility thereof without generating any interference.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a method of processing a sound track to thereby combine sounds synchronously and therefore enhance audibility thereof without generating any interference.

In order to achieve the above and other objectives, the present invention provides a method of processing a sound track, comprising the steps of:

(1) providing a low frequency threshold and a high frequency threshold of an audible frequency range;

(2) selecting a low-pitch sound band from a lowest frequency of an original sound track to the low frequency threshold and raising the low-pitch sound band by a predetermined frequency shift to a modified low-pitch sound band, or selecting a high-pitch sound band from the high frequency threshold to the highest frequency of the original sound track and lowering the high-pitch sound band by a predetermined frequency shift to a modified high-pitch sound band; and (3) combining the original sound track and the modified low-pitch sound band or combining the original sound track and the modified high-pitch sound band, wherein the low frequency threshold and the high frequency threshold are not correlated, and the predetermined frequency shift is one or multiple octaves, or the predetermined frequency shift is $2^n$, where n is one of a positive integer and a negative integer.

In the step (2) of the method of processing a sound track, the low-pitch sound band is one or multiple sound bands selected at a lower side of the original sound track, with the low-pitch sound bands being separated by one octave or by the frequency shift of $2^n$, where n is +1 or −1, wherein the low-pitch sound bands each have a predetermined frequency shift of one or multiple octaves or a predetermined frequency shift of $2^n$, where n is one of a positive integer and a negative integer, wherein the high-pitch sound band is one or multiple sound bands selected at a higher side of the original sound track, with the high-pitch sound bands being separated by one octave or by the frequency shift of $2^n$, where n is +1 or −1, wherein the high-pitch sound bands each have a predetermined frequency shift of one or multiple octaves or a predetermined frequency shift of $2^n$, where n is one of a positive integer and a negative integer.

In the step (3) of the method of processing a sound track, the original sound track and the modified low-pitch sound band are amplified by a frequency-dependent amplification curve, respectively, and then combined, wherein the original sound track and the modified high-pitch sound band are amplified by a frequency-dependent amplification curve, respectively, and then combined.

In the method of processing a sound track, the amplification curves are dynamic and instantly adjustable according to the amplitude and frequency distribution of the original sound track.

In the method of processing a sound track, the original sound track and the modified low-pitch sound band are combined and then one of a specific sound signature or an indicator prompt is added to the combined original sound track and modified low-pitch sound band if the amplitude of one of the low-pitch sound bands exceeds a preset threshold level, wherein the original sound track and the modified high-pitch sound band are combined and then one of a specific sound signature or an indicator prompt is added to the combined original sound track and modified high-pitch sound band if the amplitude of one of the high-pitch sound bands exceeds a preset threshold level.

Therefore, the present invention provides a method of processing a sound track to thereby combine sounds synchronously and therefore enhance audibility thereof without generating any interference.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Figure 1:
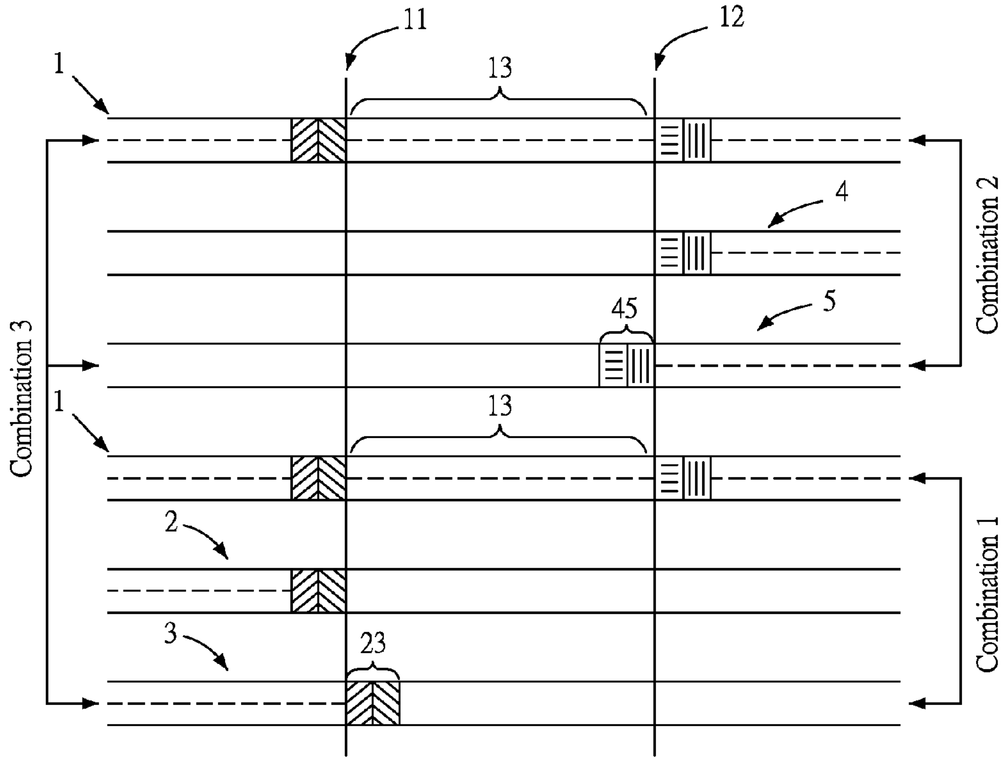
FIG. 1 is a schematic view of a preferred embodiment of the present invention.

Referring to FIG. 1, the present invention provides a method of processing a sound track, comprising the steps of:

(1) providing a low frequency threshold 11 and a high frequency threshold 12 of an audible frequency range 13, wherein data pertaining to the low frequency threshold 11 and the high frequency threshold 12 of the audible frequency range 13 is obtained by performing a hearing test on persons with normal hearing capability or persons with an auditory disability;

(2) selecting a low-pitch sound band 2 from the lowest frequency of an original sound track 1 to the low frequency threshold 11 and raising the low-pitch sound band 2 by a predetermined frequency shift 23 to a modified low-pitch sound band 3, wherein the highest frequency of the modified low-pitch sound band 3 falls between the low frequency threshold 11 and the high frequency threshold 12; for example, as shown in FIG. 1, the step (2) involves selecting the low-pitch sound band 2 from the lowest frequency of the original sound track 1 to the low frequency threshold 11 or selecting the low-pitch sound band (2" of FIG. 2) from the lowest frequency of the original sound track 1 to a frequency lower than the low frequency threshold 11; furthermore, the step (2) further involves selecting a high-pitch sound band 4 from the high frequency threshold 12 to the highest frequency of the original sound track 1 and lowering the high-pitch sound band 4 by a predetermined frequency shift 45 to a modified high-pitch sound band 5, wherein the lowest frequency of the modified high-pitch sound band 5 falls between the low frequency threshold 11 and the high frequency threshold 12; for example, as shown in FIG. 1, the step (2) further involves selecting the high-pitch sound band 4 from the high frequency threshold 12 to the highest frequency of the original sound track 1 or selecting the high-pitch sound band (4" of FIG. 2) from a frequency higher than the high frequency threshold 12 to the highest frequency of the original sound track 1; although the step (2) involves either selecting the low-pitch sound band 2 or selecting the high-pitch sound band 4, the step (2) may involve selecting the low-pitch sound band 2 and the high-pitch sound band 4 simultaneously and modifying them simultaneously;

(3) combining the original sound track 1 and the modified low-pitch sound band 3 (for example, as indicated by combination 1 of FIG. 1) or combining the original sound track 1 and the modified high-pitch sound band 5 (for example, as indicated by combination 2 of FIG. 1); simultaneously, the step (2) may involve combining the original sound track 1, the modified low-pitch sound band 3 and the modified high-pitch sound band 5 (for example, as indicated by combination 3 of FIG. 1) simultaneously, wherein the low frequency threshold 11 and the high frequency threshold 12 are not correlated, wherein each of the predetermined frequency shifts 23, 45 is one or multiple octaves; for example, as shown in FIG. 1, each of the predetermined frequency shifts 23, 45 is one octave or multiple octaves; furthermore, each of the predetermined frequency shifts 23, 45 is $2^n$, where n is a positive integer or a negative integer; for example, if the highest frequency of the low-pitch sound band 2 is 100 Hz, the highest frequency of the modified low-pitch sound band 3 can be 200 Hz, 400 Hz . . . where n is +1, +2 . . . ; furthermore, if the lowest frequency of the high-pitch sound band 4 is 10000 Hz, the lowest frequency of the modified high-pitch sound band 5 can be 5000 Hz, 2500 Hz . . . where n is −1, −2 . . . .

As described above, the present invention provides a method of processing a sound track to thereby combine an original sound and a modified sound synchronously, so as to enhance the audibility of sounds without generating any interference.

Figure 2:
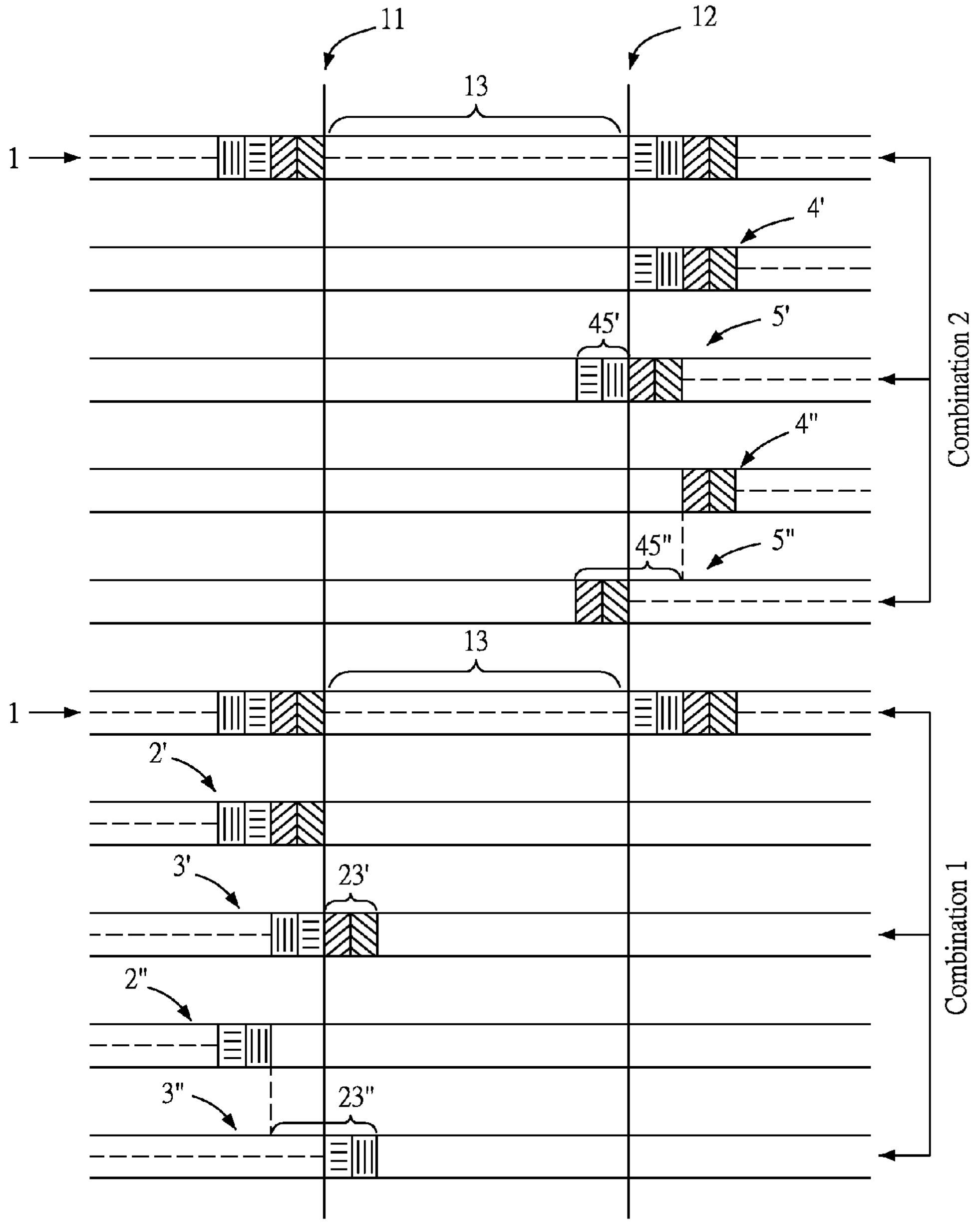
FIG. 2 is another schematic view of the preferred embodiment of the present invention.

Referring to FIG. 2, in the step (2) of the method of processing a sound track, the low-pitch sound bands 2', 2" are one sound band (2' or 2") or multiple sound bands (2' and 2") selected at a lower side of the original sound track 1, with the low-pitch sound bands (2' and 2") being separated by one octave or by the frequency shift of $2^n$, where n is +1 or −1, wherein the low-pitch sound bands 2', 2" are each separated by a predetermined frequency shifts 23', 23" of one octave 23', multiple octaves 23" (two octaves) or $2^n$, where n is a positive integer or a negative integer. Furthermore, the high-pitch sound bands 4', 4" are one sound band (4' or 4") or multiple sound bands (4' and 4") selected at a higher side of the original sound track 1, with the high-pitch sound bands (4' and 4") being separated by one octave or $2^n$, where n is +1 or −1. The predetermined frequency shifts 45', 45" of the high-pitch sound bands 4', 4" are one octave 45' or multiple octaves 45" (two octaves). The predetermined frequency shifts 45', 45" of the high-pitch sound bands 4', 4" are $2^n$, where n is a positive integer or a negative integer. Although the step (2) involves either selecting the low-pitch sound bands 2', 2" or selecting the high-pitch sound bands 4', 4", the step (2) may involve selecting them simultaneously, then modifying them simultaneously, and eventually combining them. Therefore, the method of processing a sound track of the present invention offers various combination choices as needed and therefore enhances audibility thereof.

Figure 3:
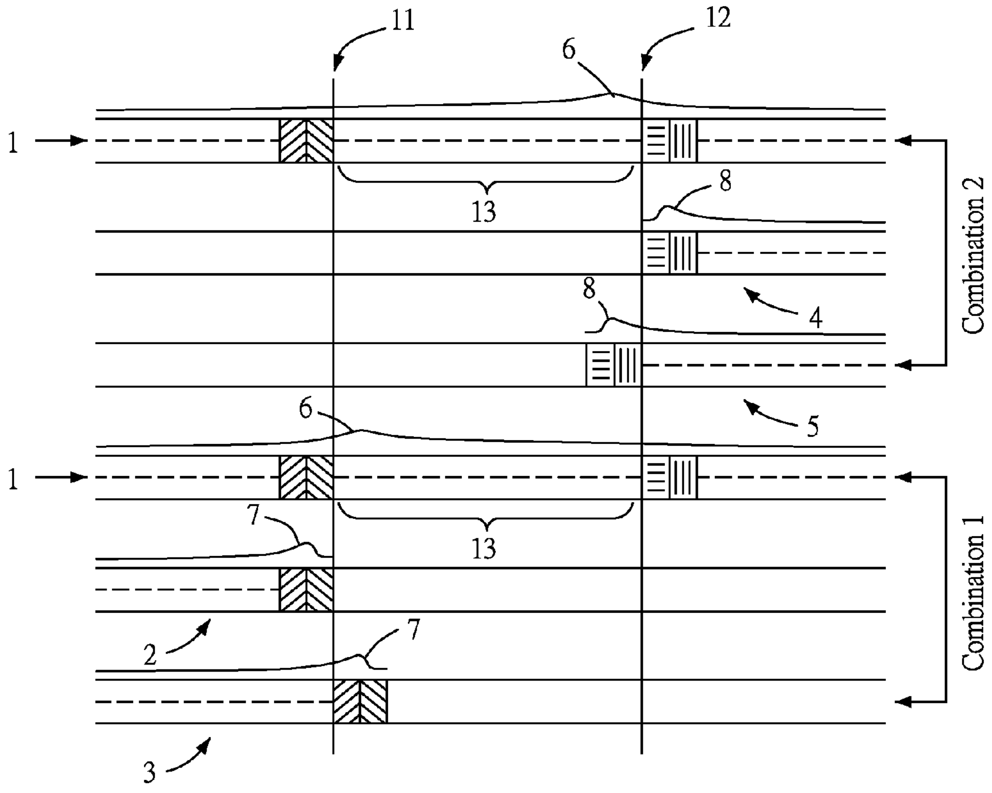
FIG. 3 is a schematic view of amplification curves of the preferred embodiment of the present invention.

Referring to FIG. 3, in the step (3) of the method of processing a sound track, the original sound track 1 and the modified low-pitch sound band 3 are amplified by frequency-dependent amplification curves 6, 7 and then combined, or, alternatively, the original sound track 1 and the modified high-pitch sound band 5 are amplified by frequency-dependent amplification curves 6, 8 and then combined. Similarly, the original sound track 1, the modified low-pitch sound band 3 and the modified high-pitch sound band 5 are amplified by frequency-dependent amplification curves 6, 7, 8 and then combined. Therefore, the method of processing a sound track of the present invention not only combines the original sound and modified sound synchronously but also amplifies the combined sounds as needed and therefore enhances audibility thereof.

Referring to FIG. 3, in the method of processing a sound track, the amplification curves 6, 7, 8 are dynamic and instantly adjustable according to the amplitude and frequency distribution of the original sound track 1. Therefore, the method of processing a sound track of the present invention offers various combination choices as needed and therefore enhances audibility thereof.

Figure 4:
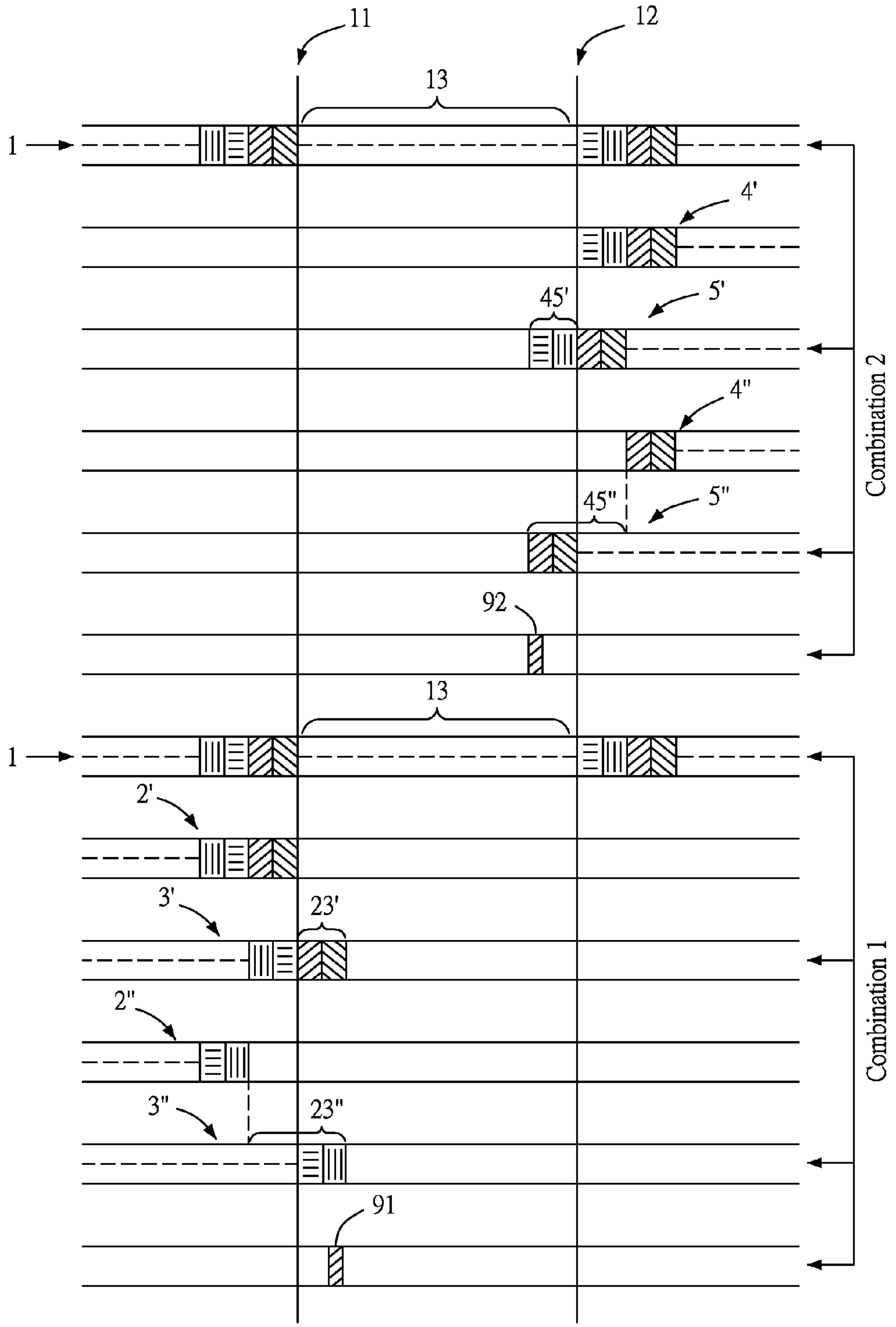
FIG. 4 is a schematic view of specific sound signatures of the preferred embodiment of the present invention.

Referring to FIG. 4, in the method of processing a sound track, a specific sound signature 91 or an indicator prompt is added to the combined original sound track 1 and modified low-pitch sound bands 3', 3" if the amplitude of one of the low-pitch sound bands 2', 2" exceeds a preset threshold level. A specific sound signature 92 or an indicator prompt is added to the combined original sound track 1 and modified high-pitch sound bands 5', 5" if the amplitude of one of the high-pitch sound bands 4', 4" exceeds a preset threshold level. Similarly, a specific sound signature or an indicator prompt is added to the combined original sound track 1, modified low-pitch sound bands 3', 3" and modified high-pitch sound bands 5', 5". Therefore, the method of processing a sound track of the present invention improves the recognition the nature of the original sound.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Therefore, the legal protection for the present invention should be defined by the appended claims.

What is claimed is:

1. A method of processing a sound track, comprising the steps of:

(1) providing a low frequency threshold and a high frequency threshold of an audible frequency range;

(2) selecting a low-pitch sound band from a lowest frequency of an original sound track to the low frequency threshold and raising the low-pitch sound band by a predetermined frequency shift to a modified low-pitch sound band, or selecting a high-pitch sound band from the high frequency threshold to the highest frequency of the original sound track and lower the high-pitch sound band by a predetermined frequency shift to a modified high-pitch sound band; and (3) combining the original sound track and the modified low-pitch sound band or combining the original sound track and the modified high-pitch sound band, wherein the low frequency threshold and the high frequency threshold are not correlated, and the predetermined frequency shift is one or multiple octaves, or the predetermined frequency shift is $2^n$ where n is one of a positive integer and a negative integer.

2. The method of claim 1, wherein, in the step (2), the low-pitch sound band is one or multiple sound bands selected at a lower side of the original sound track, with the low-pitch sound bands being separated by one octave or by the frequency shift of $2^n$ where n is +1 or −1, wherein the low-pitch sound bands each have a predetermined frequency shift of one or more octaves or a predetermined frequency shift of $2^n$ where n is one of a positive integer and a negative integer, wherein the high-pitch sound band is one or multiple sound bands selected at a higher side of the original sound track, with the high-pitch sound bands being separated by one octave or by the frequency shift of $2^n$ where n is +1 or −1, wherein the high-pitch sound bands each have a predetermined frequency shift of one or more octaves or a predetermined frequency shift of $2^n$ where n is one of a positive integer and a negative integer.

3. The method of claim 1, wherein, in the step (3), the original sound track and the modified low-pitch sound band are amplified by a frequency-dependent amplification curve, respectively, and then combined, wherein the original sound track and the modified high-pitch sound band are amplified by a frequency-dependent amplification curve, respectively, and then combined.

4. The method of claim 3, wherein the amplification curves are dynamic and instantly adjustable according to amplitude and frequency distribution of the original sound track.

5. The method of claim 2, wherein the original sound track and the modified low-pitch sound band are combined and then one of a specific sound signature or an indicator prompt is added to the combined original sound track and modified low-pitch sound band if the amplitude of one of the low-pitch sound bands exceeds a preset threshold level, wherein the original sound track and the modified high-pitch sound band are combined and then one of a specific sound signature or an indicator prompt is added to the combined original sound track and modified high-pitch sound band if the amplitude of one of the high-pitch sound bands exceeds a preset threshold level.

* * * * *